US009029255B2

(12) United States Patent
Liang et al.

(10) Patent No.: US 9,029,255 B2
(45) Date of Patent: May 12, 2015

(54) SEMICONDUCTOR DEVICE AND FABRICATION METHOD THEROF

(75) Inventors: Yu-Wei Liang, Taoyuan County (TW); Hai-Han Hung, Taoyuan County (TW); Pei-Chi Wu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 35 days.

(21) Appl. No.: 13/594,726

(22) Filed: Aug. 24, 2012

(65) Prior Publication Data
US 2014/0054720 A1 Feb. 27, 2014

(51) Int. Cl.
*H01L 21/4763* (2006.01)
*H01L 21/8234* (2006.01)
*H01L 21/8238* (2006.01)
*H01L 21/28* (2006.01)
*H01L 29/49* (2006.01)
*H01L 29/66* (2006.01)
*H01L 29/08* (2006.01)

(52) U.S. Cl.
CPC .. *H01L 21/82345* (2013.01); *H01L 21/823842* (2013.01); *H01L 21/28035* (2013.01); *H01L 29/4925* (2013.01); *H01L 29/66575* (2013.01); *H01L 29/0847* (2013.01)

(58) Field of Classification Search
CPC ............ H01L 21/322; H01L 21/823814; H01L 21/823828; H01L 21/28035
USPC .............. 438/213, 592; 257/E21.621, 382
See application file for complete search history.

(56) References Cited

U.S. PATENT DOCUMENTS

| 2002/0072182 | A1* | 6/2002 | Ha et al. | 438/301 |
| 2002/0102796 | A1* | 8/2002 | Lee et al. | 438/283 |
| 2004/0002185 | A1* | 1/2004 | Takahashi | 438/224 |
| 2006/0223252 | A1* | 10/2006 | Park et al. | 438/197 |
| 2010/0025749 | A1* | 2/2010 | Yoo et al. | 257/306 |
| 2012/0193796 | A1* | 8/2012 | Lin et al. | 257/754 |
| 2012/0302048 | A1* | 11/2012 | Santhanam et al. | 438/513 |

FOREIGN PATENT DOCUMENTS

| TW | 200525705 A | 8/2005 |
| TW | 201044511 A | 12/2010 |
| TW | 201101414 A | 1/2011 |

* cited by examiner

*Primary Examiner* — Caridad Everhart

(57) ABSTRACT

A method for fabricating a semiconductor device is provided. A first polysilicon layer of a first conductivity type is provided on a substrate having first and second active regions. An ion implantation process is performed in the polysilicon layer corresponding to the second active region by using a dopant of a second conductivity type opposite to the first conductivity type, and silane plasma is introduced during the ion implantation process to form a second polysilicon layer thereon and convert the first conductivity type of the first polysilicon layer corresponding to the second active region to the second conductivity type. The first and second polysilicon layers are patterned to form a first gate layer corresponding to the first active region and a second gate layer corresponding to the second active region. A semiconductor device is also provided.

21 Claims, 4 Drawing Sheets

SEMICONDUCTOR DEVICE AND FABRICATION METHOD THEROF

BACKGROUND

1. Technical Field

The invention relates to semiconductor technology, and in particular relates to a semiconductor device and a method for fabricating the same.

2. Description of the Related Art

For semiconductor processing, ion implantation is commonly used for forming doped regions or features in various semiconductor devices. For example, ion implantation may be used for forming source/drain regions in an NMOS, PMOS, or CMOS. However, ion implantation has its drawbacks and limitations. Among them, when performing ion implantation on a target material such as a semiconductor layer in a semiconductor device, the semiconductor layer may be damaged due to a high impact of a dopant or etching when dopants are corrosive to the semiconductor layer. For example, it has been found that fluorine-containing dopants are corrosive to silicon-containing films. Consequently, material removal (or material loss) of the semiconductor layer as well as reduction in thickness (or height) of the semiconductor layer may occur. This may complicate subsequent processes by causing problems such as over-etching into the semiconductor device beneath the semiconductor layer. As a result, the structure and performance of features already formed beneath the semiconductor layer in the semiconductor device may be damaged.

Therefore, a novel method for fabricating a semiconductor device is needed for improving or solving the aforementioned problems.

BRIEF SUMMARY

An exemplary embodiment of a method for fabricating a semiconductor device comprises providing a first polysilicon layer of a first conductivity type on a substrate having a first active region and a second active region. A first ion implantation process is performed in the polysilicon layer corresponding to the second active region by using a dopant of a second conductivity type opposite to the first conductivity type, and silane plasma is introduced during the first ion implantation process to form a second polysilicon layer thereon and convert the first conductivity type of the first polysilicon layer corresponding to the second active region to the second conductivity type. The first and second polysilicon layers are patterned to form a first gate layer corresponding to the first active region and a second gate layer corresponding to the second active region.

An exemplary embodiment of a semiconductor device comprises a substrate having a first active region and a second active region. A first polysilicon layer is formed on the substrate, having a first portion of a first conductivity type corresponding to the first active region and a second portion of a second conductivity type opposite to the first conductivity type corresponding to the second active region and separated from the first portion, wherein a first gate layer is constructed of the first portion of the first polysilicon layer, and a second gate layer is constructed of the second portion of the second polysilicon layer and the second polysilicon layer, and wherein the first gate layer and the second gate layer have substantially the same height.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

The invention provides a method of fabricating a semiconductor device that compensates for the loss of a semiconductor film due to ion implantation. The invention also provides a fabricated semiconductor device. The invention may have wide applications in various aspects of semiconductor processing. The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 7:
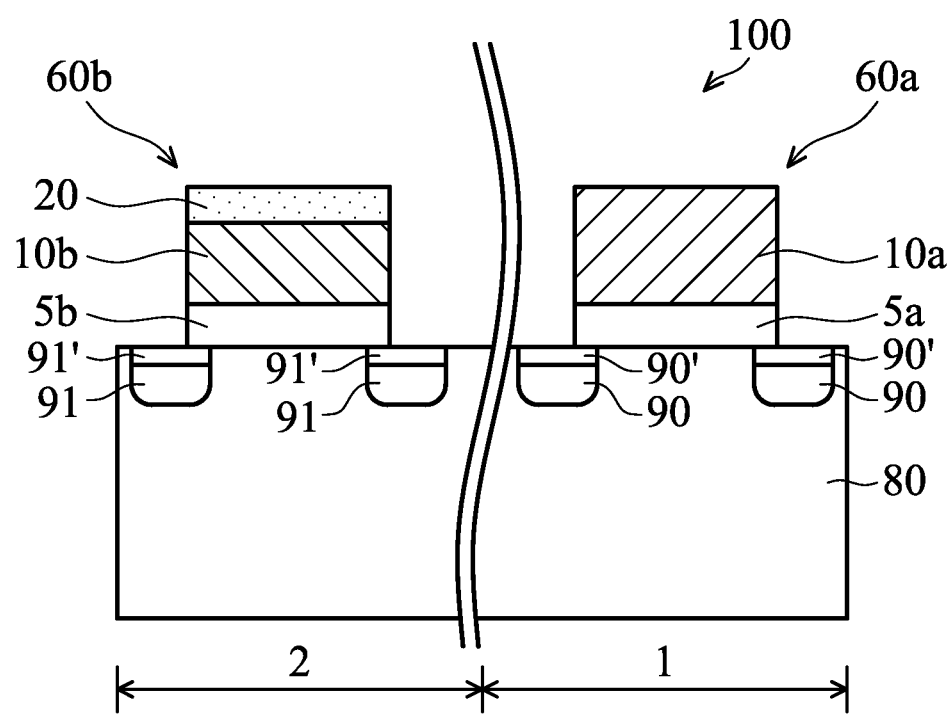

Referring to FIG. 7, a cross section of a semiconductor device 100 according to an embodiment of the invention is illustrated. The semiconductor device 100 may be implemented as a peripheral circuit (e.g., a CMOS circuit) of a memory device (e.g., dynamic random access memory, DRAM) for read, write or other operations. In the embodiment, the semiconductor device 100 comprises a substrate 80, such as a silicon substrate, having a first active region 1 and a second active region 2. In the semiconductor device 100, for example, at least one NMOS transistor may be formed corresponding to the first active region 1, and at least one PMOS transistor may be formed corresponding to the second active region 2. Alternatively, at least one PMOS transistor may be formed corresponding to the first active region 1, and at least one NMOS transistor may be formed corresponding to the second active region 2. For the sake of simplifying the figures, only the relevant features of the NMOS and the PMOS transistors are shown in FIG. 7.

A first well (not shown) and a second well (not shown) having different conductivity types from each other may be formed in the first active region 1 and the second active region 2 of the substrate 80, respectively. A shallow trench isolation (STI) structure (not shown) may be formed in the substrate 80 for definition of the first active region 1 and the second active region 2.

A first polysilicon layer 10 is disposed on the substrate 80. In the embodiment, the first polysilicon layer 10 comprises a first portion 10a of a first conductivity type corresponding to the first active region 1 and a second portion 10b of a second conductivity type opposite to the first conductivity type corresponding to the second active region 2 and separated from the first portion 10a. A second polysilicon layer 20 of the second conductivity type is on the second portion 10b of the first polysilicon layer 10. In particular, a first gate layer 60a of the semiconductor device 100 is constructed of the first portion 10a of the first polysilicon layer 10. Moreover, a second gate layer 60b of the semiconductor device 100 is constructed of the second portion 10b of the first polysilicon layer 10 and the overlying second polysilicon layer 20. It is noted that the first gate layer 60a and the second gate layer 60b may have substantially the same height.

A gate dielectric layer 5a is disposed between the substrate 80 and the first portion 10a of the first polysilicon layer 10, and a gate dielectric layer 5b is disposed between the substrate 80 and the second portion 10b of the first polysilicon layer 10.

In one embodiment, the second conductivity type is p-type, and the second gate layer 10b may comprise a dopant comprising boron, boron difluoride ($BF_2$), boron trifluoride ($BF_3$), diborane ($B_2H_6$), boron cluster ($B_{18}H_{22}$), or combinations thereof. In another embodiment, the second conductivity type is n-type, and the second gate layer 10b may comprise a dopant comprising arsenic, phosphor, or combinations thereof.

In the embodiment, the semiconductor device 100 may further comprise first source and drain regions 90 of the first conductivity type in the substrate 80 and on both sides of the first gate layer 60a, respectively, and a third polysilicon layer 90' may be formed on each of the first gate layer 60a and the first source and drain regions 90.

The semiconductor device 100 may further comprise second source and drain regions 91 of the second conductivity type formed in the substrate 80 and on both sides of the second gate layer 60b, respectively, and a fourth polysilicon layer 91' may be formed on each of the second gate layer 60b and the second source and drain regions 91.

It is noted that the top surfaces of the third polysilicon layer 90' on the first source and drain regions 90 and fourth polysilicon layer 91' on the second source and drain regions 91 may be substantially level with a top surface of the silicon substrate 80.

In the embodiments above, if the first conductivity type is the p-type, then the PMOS transistor is formed corresponding to the first active region 1, and the NMOS transistor is formed in the second active region 2. On the other hand, if the first conductivity type is n-type, then the NMOS transistor is formed in the first active region 1, and the PMOS transistor is formed in the second active region 2.

Figure 1:
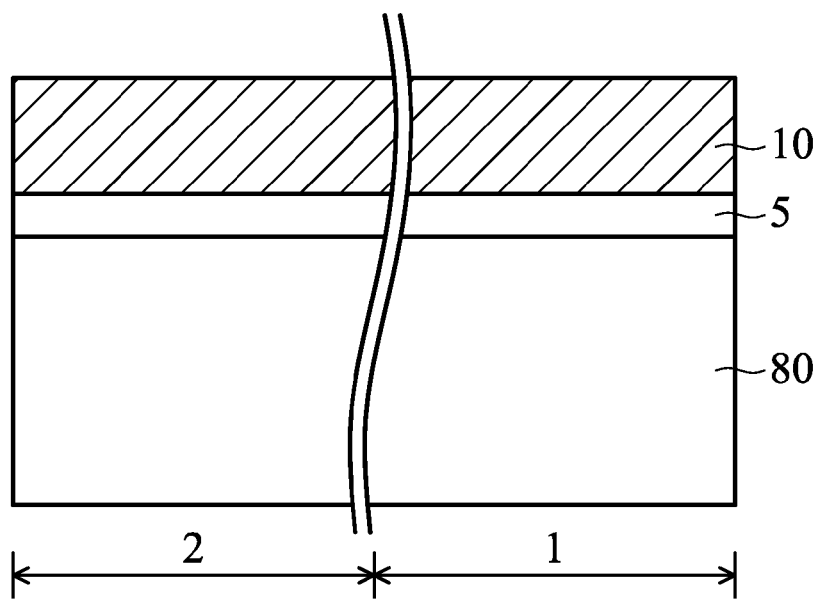
FIGS. 1-7 are cross sections of a method for manufacturing the semiconductor device 100 according to one embodiment of the invention.

FIGS. 1-7 illustrate cross sections of an embodiment of a method for fabricating a semiconductor device 100 according to the invention. Referring to FIG. 1, a substrate 80, such as a silicon substrate, is provided. The substrate 80 has a first active region 1 and a second active region 2 defined by an STI structure (not shown). A first well (not shown) and a second well (not shown) having different conductivity types from each other may be formed in the first active region 1 and the second active region 2 of the substrate 80, respectively. A dielectric layer 5, such as a layer comprising oxide, nitride, or combinations thereof, is formed on the substrate 80. A first polysilicon layer 10 of a first conductivity type is provided on the dielectric layer 5.

Figure 2:
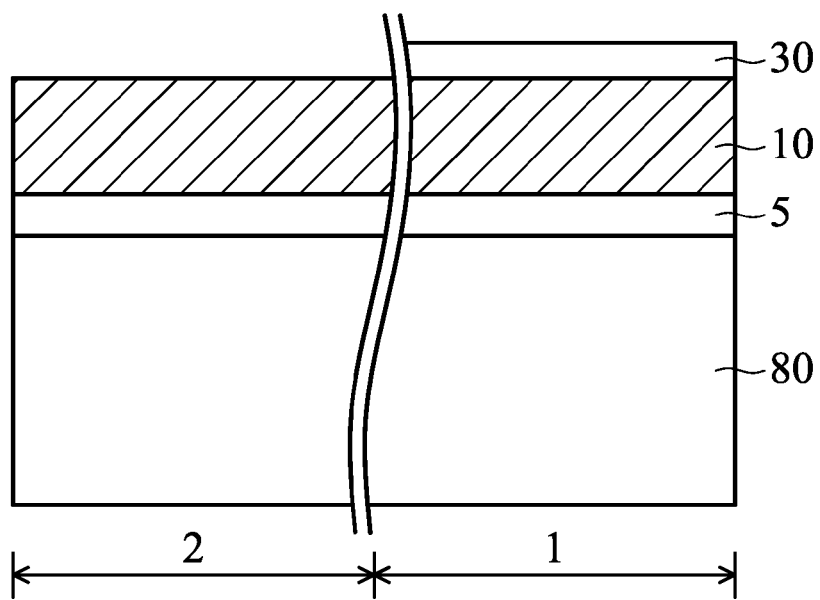

Referring to FIG. 2, a photoresist layer (not shown) is formed on the first polysilicon layer 10, and a photolithography process is performed on the photoresist layer to form a photoresist pattern layer 30, wherein the photoresist pattern layer 30 covers the first polysilicon layer 10 corresponding to the first active region 1 and exposes the polysilicon layer 10 corresponding to the second active region 2.

Figure 3:
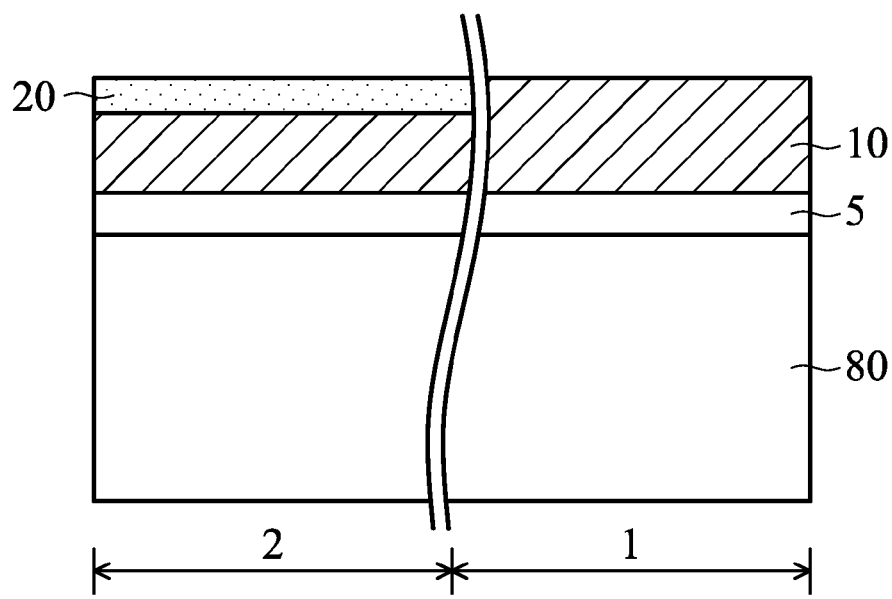

Referring to FIG. 3, a first ion implantation process is performed in the first polysilicon layer 10 corresponding to the second active region 2 using the photoresist pattern layer 30 (shown in FIG. 2) as an implant mask and using a dopant of the second conductivity type opposite of the first conductivity type, and particularly, silane plasma is introduced during the first ion implantation process, thereby forming a second polysilicon layer 20 thereon and converting the first conductivity type of the first polysilicon layer 10 corresponding to the second active region 2 to the second conductivity type. In one embodiment, the second conductivity type is p-type, and the dopant may comprise boron, boron difluoride ($BF_2$), boron trifluoride ($BF_3$), diborane ($B_2H_6$), boron cluster ($B_{18}H_{22}$), or combinations thereof. In another embodiment, the second conductivity type is n-type, and the dopant may comprise arsenic, phosphor, or combinations thereof. In such a step, the first ion implantation process and the introduction of silane plasma may be performed at the same time. Thus, although during the first ion implantation process, the dopant (i.e., implant species) may damage or etch away a portion of the first polysilicon layer 10 corresponding to the second active region 2, the introduction of the silane plasma allows for an additional polysilicon layer to be grown back thereon, so that loss of material and reduction in the height in the first polysilicon layer 10 corresponding to the second active region 2 may be prevented or compensated for. Thus, a top surface of the second polysilicon layer 20 may be substantially level with a top surface of the first polysilicon layer 10 corresponding to the first active area 1 after performing the first ion implantation process. Thereafter, the unnecessary photoresist pattern layer 30 (shown in FIG. 2) may be removed.

In the embodiments described above, adjustable parameters of the first ion implantation process may include, but are not limited to, duration, temperature, type of dopant, dose, energy, angle of doping, and so on. Further, adjustable parameters of the introduction of silane plasma may include, but are not limited to, temperature, gas flow, pressure, plasma generation power. It is noted that the first ion implantation process may be performed at low temperatures. For example, the first ion implantation process may be performed at a temperature in a range of 20° C. (or room temperature)-80° C. This may be advantageous because in the case where there are other active devices already formed in the semiconductor device 100, these active devices may not be overheated and thus damaged.

Figure 4:
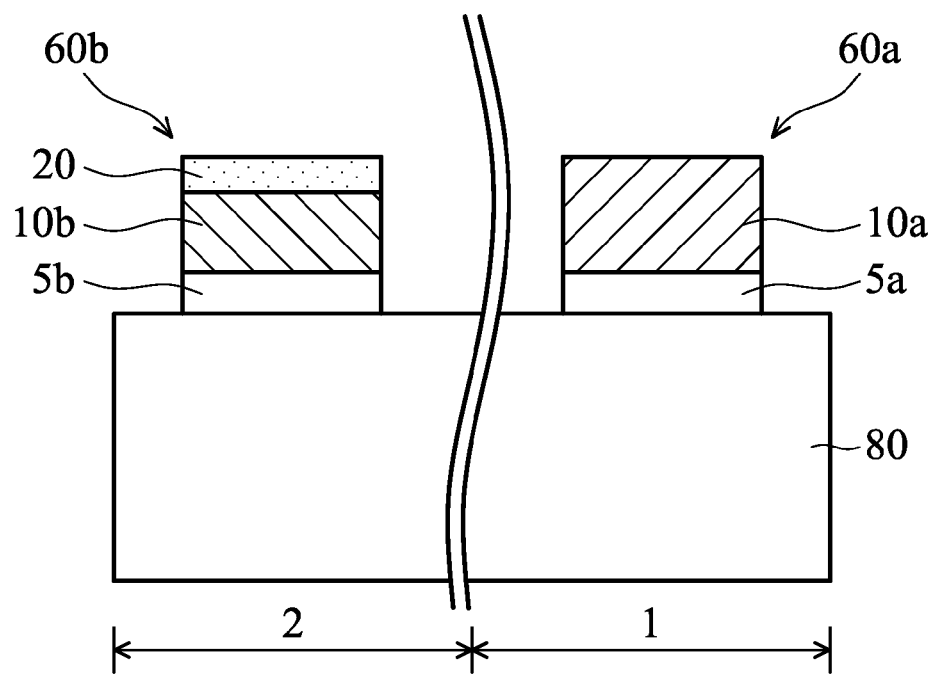

Referring to FIG. 4, the second polysilicon layer 20 and the underlying the first polysilicon layer 10 are patterned so that the first polysilicon layer 10 comprises a first portion 10a of the first conductivity type corresponding to the first active region 1 and a second portion 10b of the second conductivity type corresponding to the second active region 2 and separated from the first portion 10a. In the embodiment, a first gate layer 60a of the semiconductor device 100 is constructed of the first portion 10a of the first polysilicon layer 10. Moreover, a second gate layer 60b of the semiconductor device 100 is constructed of the second portion 10b of the first polysilicon layer 10 and the overlying second polysilicon layer 20. In one embodiment, an etching process may be performed for the patterning process. The dielectric layer 5 (shown in FIG. 3) may be similarly patterned to form a first gate dielectric layer 5a and a second gate dielectric layer 5b.

Figure 5:
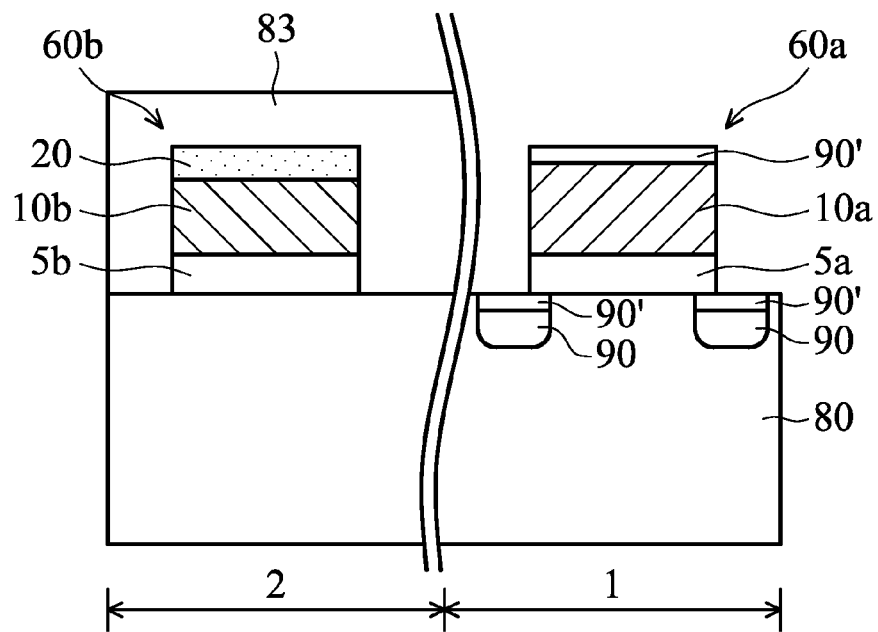
Figure 6:
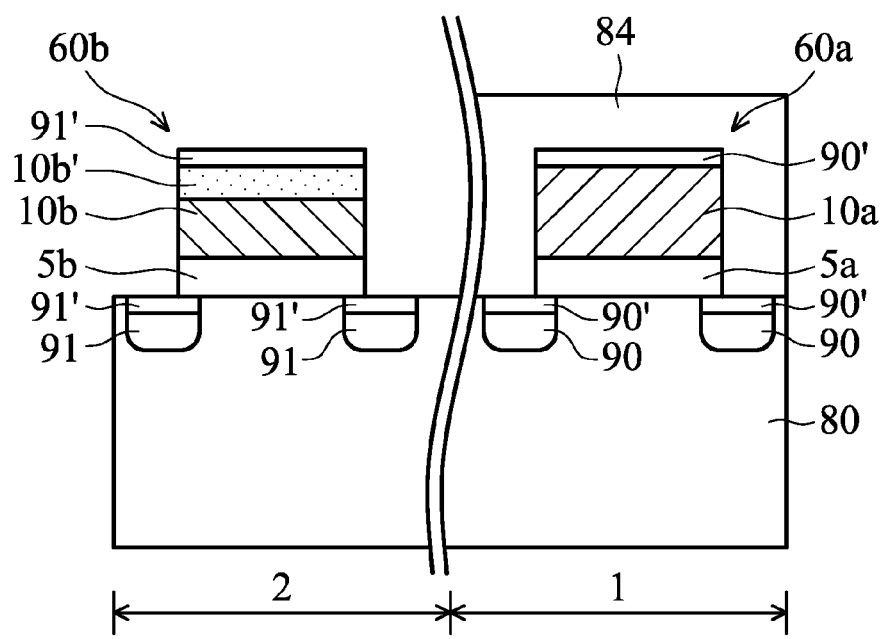

Referring to FIG. 5, a masking layer 83, such as a photoresist layer, is formed to cover a top surface and sidewalls of the second gate layer 60b and a top surface of the substrate 80 corresponding to the second active region 2 and expose the first gate layer 60a and a top surface of substrate 80 corresponding to the first active region 1. The masking layer 83 may be formed by a conventional lithography process.

First source and drain regions 90 are formed in the substrate 80 and on both sides of the first gate layer 60a, respectively. In the embodiment, the first source and drain regions 90 may be formed by performing a second ion implantation process and introducing silane plasma during the second ion implantation process. The second ion implantation process and the introduction of silane plasma may be similar to or different from those described previously in reference to FIG.

3. Therefore, a third polysilicon layer 90' may be formed on each of the first gate layer 60a and the first source and drain regions 90 after performing the second ion implantation process. As a result, a top surface of the third polysilicon layer 90' on the first source and drain regions 90 are substantially level with a top surface of the silicon substrate 80. After such a step, the unnecessary masking layer 83 is removed.

Similarly, a masking layer 84 similar to the masking layer 83 (shown in FIG. 5) is formed to cover a top surface and sidewalls of the first gate layer 60a and a top surface of the substrate 80 corresponding to the first active region 1 and expose the second gate layer 60b and a top surface of substrate 80 corresponding to the second active region 2. The masking layer 84 may be formed by the same or similar method for formation of the masking layer 83.

Second source and drain regions 91 having a conductivity type opposite to that of the first source and drain regions 90 are formed in the substrate 80 and on both sides of the second gate layer 60b, respectively. In the embodiment, similarly, the second source and drain regions 91 may be formed by performing a third ion implantation process and introducing silane plasma during the third ion implantation process. The third ion implantation process and the introduction of silane plasma may be similar to those described previously in reference to FIG. 3 or 5. A fourth polysilicon layer 91' may be formed on each of the second gate layer 60b and the second source and drain regions 91 after performing the third ion implantation process. Also, a top surface of the fourth polysilicon layer 91' on the second source and drain regions 91 are substantially level with the top surface of the silicon substrate 80. After such a step, the unnecessary masking layer 84 is removed. As a result, a semiconductor device 100 is completed, as shown in FIG. 7.

Similarly, when forming the first and second source and drain regions 90 and 91, the introduction of silane plasma compensates for the loss of material for the silicon substrate 80 due to the ion implantation processes. Thus, loss of material and reduction in height in the silicon substrate 80 may be prevented or compensated for, so that that top surfaces of the third and fourth polysilicon layers 90' and 91' are substantially level with the top surface of the substrate 80, respectively, as mentioned above.

Thus, by introducing the silane plasma for polysilicon growth while the implantation process is taking place, the invention solves the problem of loss of any polysilicon layer in semiconductor devices due to ion implantation, so that the height of the polysilicon layer remains about the same. A constant height of the polysilicon layer prevents problems such as over-etching in subsequent steps, thus making the performance of subsequent steps easier and improving reliability of the fabricated semiconductor devices.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising the steps of:
   providing a first polysilicon layer of a first conductivity type on a substrate having a first active region and a second active region;
   performing a first ion implantation process in the first polysilicon layer corresponding to the second active region by using a dopant of a second conductivity type opposite to the first conductivity type and introducing silane plasma during the first ion implantation process to form a second polysilicon layer thereon and convert the first conductivity type of the first polysilicon layer corresponding to the second active region to the second conductivity type, wherein a top surface of the second polysilicon layer is substantially level with a top surface of the first polysilicon layer in the first active region; and
   patterning the first and second polysilicon layers to form a first gate layer corresponding to the first active region and a second gate layer corresponding to the second active region.

2. The method of claim 1, wherein the second conductivity type is p-type, and the dopant comprises boron, boron difluoride ($BF_2$), boron trifluoride ($BF_3$), diborane ($B_2H_6$), boron cluster ($B_{18}H_{22}$), or combinations thereof.

3. The method of claim 1, wherein the second conductivity type is n-type, and the dopant comprises arsenic, phosphor, or combinations thereof.

4. The method of claim 1, wherein the first ion implanting process is performed at a temperature in a range of 20° C.-80° C.

5. The method of claim 1, wherein the first gate layer and the second gate layer have substantially the same height.

6. The method of claim 1, before performing the first ion implantation process, further comprising:
   forming a photoresist pattern layer, wherein the photoresist pattern layer covers the first polysilicon layer corresponding to the first active region and exposes the first polysilicon layer corresponding to the second active region.

7. The method of claim 1, wherein the substrate is a silicon substrate.

8. The method of claim 7, further comprising forming first source and drain regions in the silicon substrate on both sides of the first gate layer, respectively, by a second ion implantation process and introducing silane plasma during the second ion implantation process to form a third polysilicon layer on each of the first gate layer and the first source and drain regions.

9. The method of claim 8, wherein a top surface of the third polysilicon layer on the first source and drain regions are substantially level with a top surface of the silicon substrate.

10. The method of claim 7, further comprising forming second source and drain regions in the silicon substrate on both sides of the second gate layer, respectively, by a third ion implantation process and introducing silane plasma during the third ion implantation process to form a fourth polysilicon layer on each of the second gate layer and the second source and drain regions.

11. The method of claim 10, wherein a top surface of the fourth polysilicon layer on the second source and drain regions are substantially level with a top surface of the silicon substrate.

12. A semiconductor device, comprising:
   a substrate having a first active region and a second active region;
   a first polysilicon layer formed on the substrate, having a first portion of a first conductivity type corresponding to the first active region and a second portion of a second conductivity type opposite to the first conductivity type corresponding to the second active region and separated from the first portion; and a second polysilicon layer of the second conductivity type on the second portion of the first polysilicon layer, wherein a first gate layer is constructed of the first portion of the first polysilicon layer and a second gate layer is constructed of the second portion of the first polysilicon layer and the second polysilicon layer, and wherein the first gate layer and the second gate layer have substantially the same height.

13. The semiconductor device of claim 12, wherein the second conductivity type is p-type, and the second gate layer comprises a dopant comprising boron, boron difluoride ($BF_2$), boron trifluoride ($BF_3$), diborane ($B_2H_6$), boron cluster ($B_{18}H_{22}$), or combinations thereof.

14. The semiconductor device of claim 12, wherein the second conductivity type is n-type, and the second gate layer comprises a dopant comprising arsenic, phosphor, or combinations thereof.

15. The semiconductor device of claim 12, further comprising a gate dielectric layer disposed between the substrate and the first polysilicon layer.

16. The semiconductor device of claim 12, wherein a top surface of the second polysilicon layer is substantially level with a top surface of the first portion of the first polysilicon layer.

17. The semiconductor device of claim 12, wherein the substrate is a silicon substrate.

18. The semiconductor device of claim 17, further comprising:
first source and drain regions in the silicon substrate on both sides of the first gate layer, respectively; and
a third polysilicon layer on each of the first gate layer and the first source and drain regions.

19. The semiconductor device of claim 18, wherein a top surface of the third polysilicon layer on the first source and drain regions are substantially level with a top surface of the silicon substrate.

20. The semiconductor device of claim 17, further comprising:
second source and drain regions in the silicon substrate on both sides of the second gate layer, respectively;
a fourth polysilicon layer on each of the second gate layer and the second source and drain regions.

21. The semiconductor device of claim 20, wherein a top surface of the fourth polysilicon layer on the second source and drain regions are substantially level with a top surface of the silicon substrate.

* * * * *

UNITED STATES PATENT AND TRADEMARK OFFICE
CERTIFICATE OF CORRECTION

PATENT NO. : 9,029,255 B2
APPLICATION NO. : 13/594726
DATED : May 12, 2015
INVENTOR(S) : Yu-Wei Liang, Hai-Han Hung and Pei-Chi Wu It is certified that error appears in the above-identified patent and that said Letters Patent is hereby corrected as shown below:

on the title page, item (54) and in the specification, column 1, lines 1-2, should read:

SEMICONDUCTOR DEVICE AND FABRICATION METHOD THEREOF

Signed and Sealed this
Fifteenth Day of September, 2015

Michelle K. Lee
*Director of the United States Patent and Trademark Office*